United States Patent [19]

Wehrli et al.

[11] Patent Number: 4,570,119
[45] Date of Patent: Feb. 11, 1986

[54] METHOD FOR VISUALIZATION OF IN-PLANE FLUID FLOW BY PROTON NMR IMAGING

[75] Inventors: Felix W. Wehrli, Shorewood; James R. MacFall, Hartland, both of Wis.

[73] Assignee: General Electric Company, Milwaukee, Wis.

[21] Appl. No.: 552,209

[22] Filed: Nov. 15, 1983

[51] Int. Cl.⁴ ............................................. G01R 33/08
[52] U.S. Cl. .................................. 324/306; 324/309
[58] Field of Search .............. 324/300, 306, 307, 309, 324/311, 313, 314

[56] References Cited

U.S. PATENT DOCUMENTS

| | | | |
|---|---|---|---|
| 4,471,306 | 9/1984 | Edelstein | 324/309 |
| 4,506,222 | 3/1985 | Edelstein | 324/309 |
| 4,516,075 | 5/1985 | Moran | 324/306 |

Primary Examiner—Michael J. Tokar
Attorney, Agent, or Firm—Alexander M. Gerasimow; Douglas E. Stoner

[57] ABSTRACT

A method for visualizing in-plane flow utilizing an NMR pulse sequence to produce a plurality of odd and even spin-echo signals occurring respectively at echo delay times, $T_E$, of $2\tau$, $6\tau$, $10\tau$, etc., and $4\tau$, $8\tau$, $12\tau$, etc. In the preferred embodiment, a fictitious spin-echo amplitude is calculated from the odd and even spin-echo signals at an echo delay time $T_E=0$, for example. The calculated values for the odd spin-echo signals are lower than those calculated for the even spin-echo signals due to incomplete rephasing of the odd spin-echo signals in the presence of a read-out magnetic field gradient and flow. Subtraction of the calculated image pixel value of the odd spin-echo signals from the calculated pixel values of the even spin-echo signals results in a difference image which highlights the flowing nuclear spins. The image pixels due to stationary nuclear spins experience exact cancellation.

9 Claims, 7 Drawing Figures

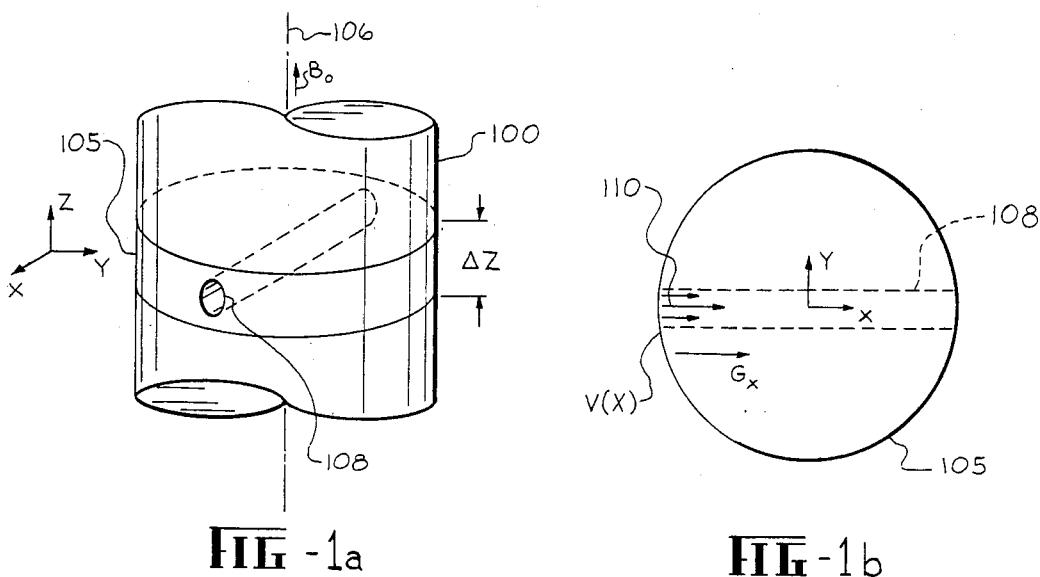
FIG-1a  FIG-1b
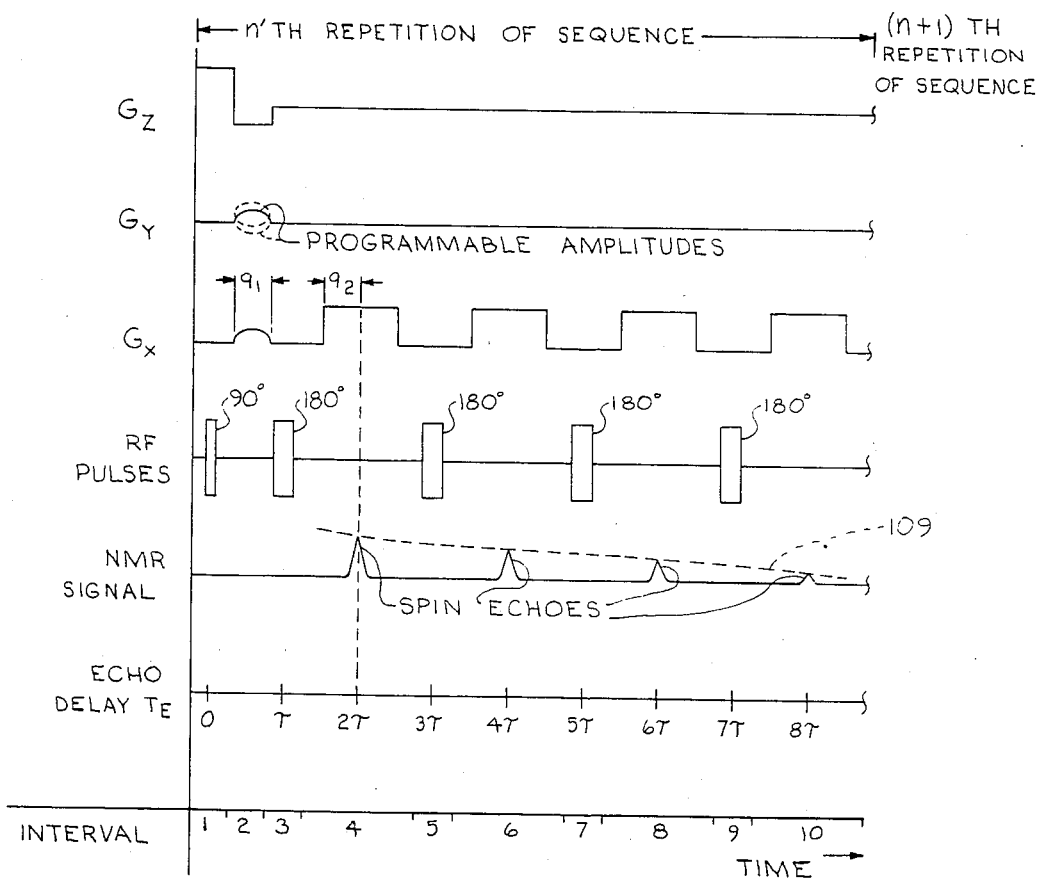
FIG-2

METHOD FOR VISUALIZATION OF IN-PLANE FLUID FLOW BY PROTON NMR IMAGING

BACKGROUND OF THE INVENTION

This invention relates to methods utilizing nuclear magnetic resonance (NMR) techniques for imaging fluid flow. The invention has particular applicability, but is not limited, to the measurement of blood flow in medical diagnostic studies.

By way of background, the nuclear magnetic resonance phenomenon occurs in atomic nuclei having an odd number of protons and/or neutrons. Due to the spin of the protons and the neutrons, each such nucleus exhibits a magnetic moment, such that, when a sample composed of such nuclei is paced in a static, homogeneous magnetic field, $B_o$, a greater number of nuclear magnetic moments align with the field to produce a net macroscopic magnetization M in the direction of the field. Under the influence of the magnetic field $B_o$, the magnetic moments precess about the axis of the field at a frequency which is dependent on the strength of the applied magnetic field and on the characteristics of the nuclei. The angular precession frequency, $\omega$, also referred to as the Larmor frequency, is given by the equation $\omega = \gamma B$, in which $\gamma$ is the gyromagnetic ratio which is constant for each NMR isotope and wherein B is the magnetic field acting upon the nuclear spins. It will be thus apparent that the resonant frequency is dependent on the strength of the magnetic field in which the sample is positioned.

The orientation of magnetization M, normally directed along the magnetic field $B_o$, may be perturbed by the application of magnetic fields oscillating at the Larmor frequency. Typically, such magnetic fields designated $B_1$ are applied orthogonal to the direction of the static magnetic field by means of a radio-frequency (RF) pulse through coils connected to a radio-frequency transmitting apparatus. The effect of field $B_1$ is to rotate magnetization M about the direction of the $B_1$ field. This may be best visualized if the motion of magnetization M due to the application of RF pulses is considered in a Cartesian coordinate system which rotates at a frequency substantially equal to the resonant frequency about the main magnetic field $B_o$ in the same direction in which the magnetization M precesses. In this case, the $B_o$ field is chosen to be directed in the positive direction of the Z axis, which, in the rotating Cartesian system, is designated Z' to distinguish it from the fixed-coordinate system. Similarly, the X and Y axes are designated X' and Y'. Bearing this in mind, the effect of an RF pulse, then, is to rotate magnetization M, for example, from its direction along the positive Z' axis toward the transverse plane defined by the X' and Y' axes. An RF pulse having either sufficient magnitude or duration to rotate magnetization M into the transverse plane (i.e., 90° from the direction of the $B_o$ field) is conveniently referred to as a 90° RF pulse. Similarly, if either the magnitude or the duration of an RF pulse is selected to be twice that of a 90° pulse, magnetization M will change direction from the positive Z' axis to the negative Z' axis. This kind of an RF pulse is referred to as a 180° RF pulse, or for obvious reasons, as an inverting pulse. It should be noted that a 90° or a 180° RF pulse will rotate magnetization M through the corresponding number of degrees from any initial direction of magnetization M. It should be further noted that an NMR signal will only be observed if magnetization M has a net transverse component (perpendicular to $B_o$) in the transverse plane. A 90° RF pulse produces maximum net transverse magnetization in the transverse plane since all of magnetization M is in that plane, while a 180° RF pulse does not produce any transverse magnetization.

RF pulses may be selective or nonselective. Selective pulses are typically modulated to have a predetermined frequency content so as to excite nuclear spins situated in preselected regions of the sample having precession frequencies as predicted by the Larmor equation. The selective pulses are applied in the presence of localizing magnetic-field gradients. Nonselective pulses generally affect all of the nuclear spins situated within the field of the RF pulse transmitter coil and are typically applied in the absence of localizing magnetic field gradients.

There are two exponential time constants associated with longitudinal and transverse magnetizations. The time constants characterize the rate of return to equilibrium of these magnetization components following the application of perturbing RF pulses. The first time constant is referred to as the spin-lattice relaxation time ($T_1$) and is the constant for the longitudinal magnetization to return to its equilibrium value. Spin-spin relaxation time ($T_2$) is the constant for the transverse magnetization to return to its equilibrium value in a perfectly homogeneous field $B_o$. In fields having inhomogeneities, the time constant for transverse magnetization is governed by a constant denoted $T_2^*$, with $T_2^*$ being less than $T_2$. In some instances, it is desirable to rapidly dissipate transverse magnetization component by applying a magnetic field gradient, as will be described more fully hereinafter.

There remains to be considered the use of magnetic field gradients to encode spatial information (used to reconstruct images, for example) into NMR signals. Typically, three such gradients are necessary:

$$G_x(t) = \partial B_o / \partial x,$$

$$G_y(t) = \partial B_o / \partial y, \text{ and}$$

$$G_z(t) = \partial B_o / \partial z.$$

The $G_x$, $G_y$, and $G_z$ gradients are constant throughout the imaging slice, but their magnitudes are typically time dependent. The magnetic fields associated with the gradients are denoted, respectively, $b_x$, $b_y$, and $b_z$, wherein $$b_x = G_x(t)x,$$

$$b_y = G_y(t)y, \text{ and}$$

$$b_z = G_z(t)z$$

within the volume.

The NMR phenomenon has been utilized by structural chemists to study in vitro the molecular structure of organic molecules. More recently, NMR has been developed into an imaging modality utilized to obtain transaxial images of anatomical features of live human subjects, for example. Such images depicting nuclear-spin distribution (typically protons associated with water in tissue) spin lattice ($T_1$), and/or spin-spin ($T_2$) relaxation constants are of medical diagnostic value in determining the state of health of tissue in the region examined. NMR techniques have also been extended to in-vivo spectroscopy of such elements as phosphorus and carbon, for example, providing researchers with the tools for the first time to study chemical processes in a living organism. Equally important is the use of NMR as a non-invasive modality to study the direction and velocity of blood flows. Blood flow studies typically rely on NMR signals produced by protons associated with water molecules contained in blood fluid. It is with the flow measurement application of NMR that the present invention is concerned.

Most conventional flow imaging techniques are either based on time-of-flight principles, phase encoding, or modulation of the free precession frequency due to flow along a gradient during the free precessiuon interval. These techniques are described respectively by I. R. Young, et al, Am. J. Roentgenol. Vol. 137, p. 895 (1981); P. R. Moran, Mag. Res. Img., Vol. 1, pp. 197-203 (1982); and H. A. Lent, et al, Second Annual Meeting of The Society of Magnetic Resonance in Medicine, San Francisco, Aug. 16-19, 1983, Abstract page 211 in Book of Abstracts. Semi-quantitative flow studies have also been conducted by making use of the standard spin-echo sequence in which the signal intensity in the presence of fluid flow is reduced due to a combination of dephasing effects occurring during the interpulse interval (i.e., the time between the 90° excitation and the 180° inverting pulses). The semi-quantitative techniques have also taken advantage of the dephasing effects occurring during the time between successive repetitions of the pulse sequence. Another effect utilized in semi-quantitative flow studies has its origin in a reduction of the spin-echo signal amplitude due to the motion of nuclear spins in the presence of a magnetic field gradient, as first described by Carr and Purcell, Physics Rev., Vol. 94, p. 630 (1954). The method for visualization of in-plane flow in accordance with the invention makes use of the latter phenomenon in a unique and unobvious manner.

It is one object of the invention to provide a method for reconstructing pure-flow images in which contributions from stationary nuclear spins are removed by cancellation.

It is another object of the invention to provide a method for reconstructing flow images which is compatible with conventional multiple echo proton image reconstruction techniques.

SUMMARY OF THE INVENTION

In accordance with the invention a method is provided for imaging nuclear spin flow in a predetermined object region. The region is positioned in a homogeneous magnetic field and is oriented relative to a read-out magnetic field gradient such that the flow has a velocity component in the direction thereof. The nuclear spins in the predetermined region are excited to resonance and then subjected to a phase-encoding gradient having a plurality of programmable amplitude-duration products. A plurality of each of odd- and even-numbered spin-echo signals is produced (in the preferred embodiment) by irradiating the object region with an equal plurality of inverting RF pulses. The odd ones of the spin-echo signals have reduced amplitudes relative to the even ones of the spin-echo signals due to the dephasing effects induced by flow in the presence of the read-out gradient. The odd and even echo signals are sampled and Fourier analyzed to yield, respectively, odd and even image pixel data arrays. The corresponding image pixel values in each of the arrays is then combined to eliminate image contributions due to stationary nuclear spins, leaving substantially only difference signal contributions due to flowing nuclear spins in the predetermined region. The obtained difference signals can be displayed to yield an image emphasizing flowing nuclear spins.

BRIEF DESCRIPTION OF THE DRAWING

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

FIG. 1a illustrates an NMR sample positioned in a static magnetic field and having a planar volume defined therein by selective excitation;

FIG. 1b is a top view of the planar volume selected in FIG. 1a and which includes a vessel for fluid flow;

FIG. 2 depicts an exemplary embodiment of a four-spin-echo NMR pulse sequence useful with the inventive method;

DETAILED DESCRIPTION OF THE INVENTION

Figure 3:
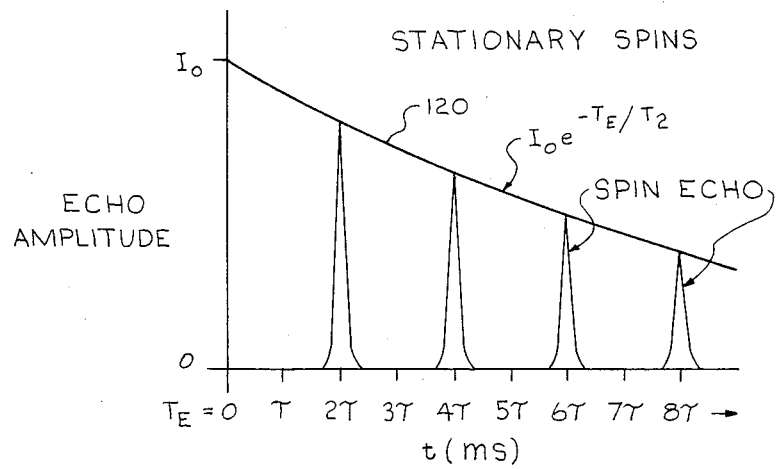
FIG. 3 illustrates a train of NMR spin-echo signals produced by stationary nuclear spins.

FIG. 1a depicts an NMR sample 100 situated in a static homogeneous magnetic field $B_o$ directed in the positive Z-axis direction of the Cartesian coordinate system. The Z axis is selected to be coincident with the longitudinal axis 106 of sample 100. The origin of the coordinate system is tken to be the center of the sample, which is also at the center of a planar slice 105 selected by the principle of selective excitation in the presence of a magnetic field gradient, as will be described hereinafter with reference to FIG. 2. There is also shown in FIG. 1a a vessel 108 shown by way of example as being generally parallel to the X axis. Vessel 108 acts as a conduit for fluid flow and in medical diagnostic applications may, in fact, comprise a blood vessel. The $B_o$ field is applied continuously during NMR studies, and therefore, is not shown on any of the Figures depicting pulse sequences.

FIG. 2 depicts a two-dimensional spin-warp imaging sequence which is a special case of the NMR imaging method known as Fourier transform NMR. Referring now to FIG. 2, it will be observed that in interval 1 indicated along the horizontal axis a positive $G_z$ gradient pulse is applied. The direction of the $G_z$ gradient is arbitrarily selected to be in the positive Z-axis direction of the Cartesian coordinate system and coincides with the direction of the $B_o$ magnetic field. Also, in interval 1, a selective 90° RF pullse is applied in the presence of the $G_z$ gradient pulse so as to excite nuclear spins in planar volume 105 shown in FIG. 1a. The thickness in $\Delta Z$ of slice 105 and its position along axis 106 of sample 100 are determined by the amplitude of the $G_z$ gradient and the frequency content of the selective 90° RF pulse.

To practice the method of the invention, the position of slice 105 is selected so as to include therein vessel 108 which contains the fluid flow to be studied. The orientation of vessel 108 should in general be such as to include a velocity component in the direction of a read-out gradient which is described hereinafter. In the configuration depicted in FIG. 1a, vessel 108 is shown substantially parallel to the X axis. In this case, the read-out gradient would also be applied in the X-axis direction. In practice, the direction of the read-out gradient need not be restricted to the X axis. In the preferred embodiments of the invention, the RF pulse is modulated by a sinc function (sin x/x) so as to preferentially excite nuclear spins in an imaging slice having a substantially rectangular profile. The 90° RF pulse can also be modulated by other functions such a a Gaussian function in which case the profile of slice 105 will be Gaussian.

At the end of interval 1, the excited nuclear spins precess at the same frequency but are out of phase with one another, due to the dephasing effect of the $G_z$ gradient. Phase coherence in the excited nuclear spins is re-established by the application in interval 2 of a negative $G_z$ gradient pulse. Typically, the time interval of the waveform of the $G_z$ gradient over interval 2 required to rephase the nuclear spins is selected to be approximately equal to the negative one half of the time integral of the $G_z$ gradient waveform in interval 1. Also, during interval 2, a phase-encoding $G_y$ gradient is applied simultaneously with the application of a positive $G_x$ gradient pulse. In the preferred embodiment, $G_y$ gradient has a single, peak amplitude during the n'th repetition of the sequence comprising intervals 1–10 as shown in FIG. 2. In each successive application, such as the (n+1)th repetition of the sequence, a different amplitude of the $G_y$ gradient is selected. The $G_y$ gradient encodes spatial information in the Y-axis direction by introducing a twist in the orientation of the transverse magnetization by a multiple of $2\pi$. Following the application of a first phase-encoding gradient, the transverse magnetization is twisted into a one-turn helix. Each different amplitude of the $G_y$ gradient introduces a different degree of twist (phase encoding). The number, n, of programmable $G_y$ gradient amplitudes is chosen to be equal to the number of resolution elements (typically 128 or 256) the reconstructed image will have in the Y-axis direction. It will be recognized that, although the preferred embodiment of the pulse sequence is disclosed with reference to programmable $G_y$ gradient amplitudes, phase encoding can also be achieved using phase-encoding gradients having programmable amplitude-duration products.

The effect of the $G_x$ gradient in interval 2 is to dephase the nuclear spins by a predetermined amount such that, when a 180° RF pulse is applied in interval 3 at a time $\tau$ following the mean application of the 90° RF pulse, a spin-echo signal will be observed in interval 4. The time of occurrence of the spin-echo signal, $T_E$, is determined by the intensity of the $G_x$ gradient applied in interval 2, the time the 180° pulse is applied, as well as the amplitude of the $G_x$ gradient in interval 4. For example, for a spin echo to occur at $T_E = 2\tau$ following the mean application of the 90° RF pulse in interval 1, the amplitudes of the $G_x$ gradients in intervals 2 and 4 must be selected such that the integral of the $G_x$ gradient waveform over a time interval $q_1$ is equal to the time integral of the $G_x$ gradient waveform over a time interval $q_2$. In the pulse sequence depicted in FIG. 2, additional 180° RF pulses are applied in intervals 5, 7, and 9 so as to produce NMR spin-echo signals in intervals 6, 8, and 10, respectively. The amplitudes of successive spin-echo signals are shown as decreasing exponentially (as suggested by line 109, FIG. 2) at a rate which is proportional to the transverse relaxation time $T_2$. It should be noted that gradient-reversal techniques could also be advantageously employed with the method of the invention to produce the spin-echo signals.

Spatial information is encoded in the direction of the X axis by the application of read-out magnetic field gradient $G_x$ pulses during the occurrence of the spin-echo signals in intervals 4, 6, 8, and 10. The effect of these gradient pulses is to cause the nuclear spins to resonate at frequencies characteristic of their locations with respect to the X axis. Each of the spin-echo signals is sampled a number of times which is typically equal to the number of resolution elements (128 or 256) the reconstructed image will have in the X-axis direction. In the course of a complete scan of slice 105, the $G_y$ gradient is sequenced through, for example, 128 programmable amplitudes, such that 128 different spin-echo signals are observed in each of intervals 4, 6, 8, and 10. The data associated with each set of spin-echo signals in each interval can be used to reconstruct an image. The image pixel values are obtained from the sampled signals in a well-known manner using a two-dimensional Fourier transform (in the case of a two-dimensional Fourier transform scheme).

FIG. 3 depicts a train of four spin-echo signals substantially identical to those described with reference to FIG. 2. The spin echoes are shown as having exponentially decaying amplitudes lying along a line defined by $I_0 e^{-TE/T_2}$. Such a train of spin-echo signals is typically observed for a slice 105 having substantially stationary nuclear spins. In the absence of flow, there is complete re-focussing of the nuclear spins such that the phase-angle $\phi$ relative to the initial phase of the signal is zero. The primary factor operating to reduce spin-echo signal amplitude is due to the decay in the amplitude of the transverse magnetization due to transverse ($T_2$) relaxation. In the ensuing description, the spin echoes occurring at times $2\tau$, $6\tau$, $10\tau$, etc., will be referred to as odd spin echoes; while spin-echo signals occurring at time $4\tau$, $8\tau$, $12\tau$, etc., will be referred to as the even spin-echo signals.

In accordance with the invention, slice 105 is carefully selected to contain within the plane thereof the portion of vessel 108 in which flow is to be studied. As indicated previously, the direction of the vessel is selected so as to generally coincide with the direction of the read-out gradient. The X axis has been selected by way of example as being the direction in which the $G_x$ read-out gradient is applied as described hereinbefore with reference to FIG. 2. It should be noted that the read-out gradient could also be applied in a different direction, in which case the programmable phase amplitude gradient ($G_y$) would be applied in a direction orthogonal to the read-out gradient. In practice, vessel 108 need not be oriented parallel to the direction of the read-out gradient. All that is necessary is that a finite flow velocity component in the direction of the read-out gradient be present.

Figure 4:
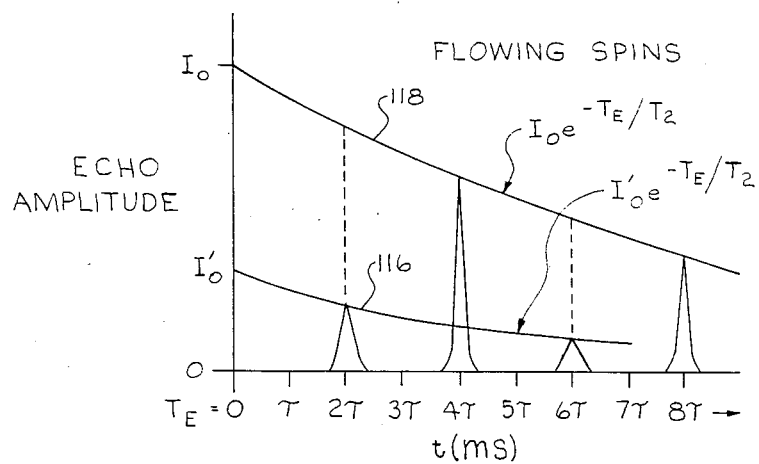
FIG. 4 is similar to FIG. 3 and depicts a train of NMR spin-echo signals having variable amplitudes due to flow of nuclear spins.
Figure 5:
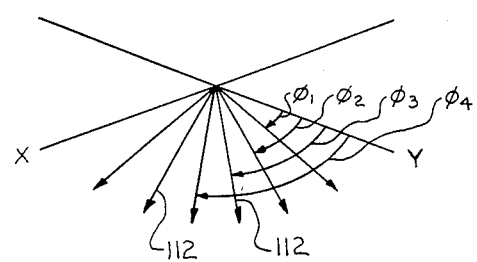
FIG. 5 depicts the dephasing of nuclear spins in the planar volume under the influence of a magnetic field gradient.

The method of the invention will now be described with initial reference to FIG. 1b which depicts an assembly of nuclear spins 110 flowing with a velocity v(x) in the X-axis direction in vessel 108. Slice 105 is subjected to the NMR pulse sequence depicted in FIG. 2 in which the direction of the $G_x$ read-out gradient is coincident with a velocity component of current flow within the vessel. As before, 180° RF pulses are applied in the direction of the Y axis orthogonal to the direction of the $B_o$ field so as to produce spin-echo signals at times $2\tau$, $4\tau$, $6\tau$, and $8\tau$. The resulting spin-echo train is illustrated in FIG. 4 in which it will be observed that the odd spin-echo signals occurring at times $2\tau$ and $6\tau$ have a diminished amplitude relative to the same spin echoes in FIG. 3. The odd spin-echo signals depicted in FIG. 4 decay along an exponential curve 116 defined by $I_o'e^{-T_E/T_2}$. However, their amplitudes are much reduced, due to fluid flow in the presence of the $G_x$ gradient. Since flow in vessel 108 is characterized by a velocity distribution given by the nature of the flow, a dephasing of the nuclear spins occurs at a time where the odd-numbered spin echoes are expected. The dephasing of the nuclear spins leads to a reduction in the spin-echo signal amplitude. The dephasing effect is illustrated graphically in FIG. 5 in which nuclear spin isochromats schematically denoted by arrows 112 have accumulated different phase angles $\phi_1$, $\phi_2$, $\phi_3$, and $\phi_4$, caused by the different flow velocities in the presence of the $G_x$ gradient.

The phase accumulation for the odd spin-echo signals will now be described with reference to FIG. 6 which depicts the 90° and 180° RF pulses and the read-out $G_x$ gradient which is active between the RF pulses in a fashion similar to that already described with reference to FIG. 2. The incremental frequency of the spins after traversing a distance dx in vessel 108 in the direction of the gradient $G_x$ is $d\omega$. Assuming a steady flow within vessel 108 with a velocity v, $d\omega$ can then be written $$d\omega = \gamma G_x v_x dt, \text{ or } \omega = \gamma G_x v_x t. \tag{1}$$

The accumulated phase angle $\phi$ at a time $t=\tau$ in which the first 180° RF pulse is applied can be expressed as $$\phi(\tau) = \int_0^\tau \omega \, dt = \int_0^\tau \gamma G_x v_x t \, dt = \gamma G_x v_x \tau^2/2 \tag{2}$$

The 180° pulse applied at time $\tau$ inverts the sign of the phase angle such that the accumulated phase angles during period $t=2\tau$ can be expressed as $$\phi(2\tau) = -\phi(\tau) + \int_\tau^{2\tau} \gamma G_x v_x t \, dt = \gamma G_x v_x \tau^2 \tag{3}$$

Similarly, the accumulated phase angle during intervals $t=3\tau$ and $t=4\tau$ can be expressed as $$\phi(3\tau) = \phi(2\tau) + \int_{2\tau}^{3\tau} \gamma G_x v_x t \, dt = 7/2 \, \gamma G_x v_x \tau^2 \tag{4}$$

$$\phi(4\tau) = -\phi(3\tau) + \int_{3\tau}^{4\tau} \gamma G_x v_x t \, dt = 0 \tag{5}$$

Figure 6:
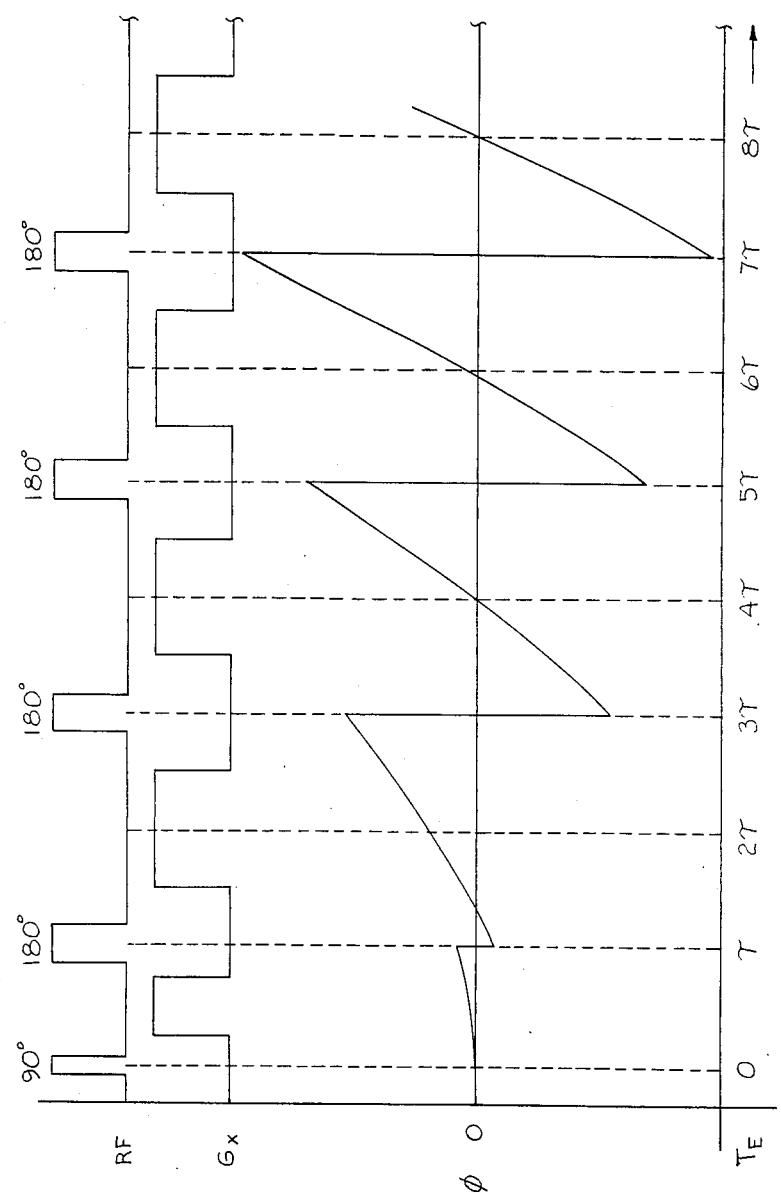
FIG. 6 depicts graphically the differential phases between odd and even spin-echo signals.

It will be noted from Equation (5) and FIG. 6 that at $t=4\tau$, that is, the time of occurrence of the first even spin-echo signal, the accumulated phase angle is equal to zero. This is in agreement with the observed spin-echo signals and described with reference to FIGS. 3 and 4 in which the even spin echoes have been attenuated by $T_2$ decay only, unaffected by fluid flow. The increase in accumulated phase in the presence of the $G_x$ gradient with increasing time is evident in FIG. 6 in which the amplitude of angle $\phi$ is observed to be increasing.

In accordance with the present invention, a pure flow image is generated by adding and subtracting suitably intensity-weighted images reconstructed from odd and even spin-echo signals. A flow enhanced image could be obtained by summing image pixel data derived from even spin-echo signals and subtracting image pixel data obtained from odd spin echoes. However, exact cancellation of the stationary proton signals cannot be achieved in this manner because subsequent odd and even spin-echo signals do not have equal amplitudes as is evident from FIG. 4.

It is initially beneficial to consider intensity-weighted images obtained utilizing spin-echo-signal data from stationary protons. For the stationary protons the image pixel values obtained from the four successive spin-echo signals (both odd and even) are determined by a decaying exponential (FIG. 3). In this case, the spin-echo signals map out the $T_2$ decay curve:

$$I(T_E) = I_o e^{-T_E/T_2} \tag{6}$$

where $T_E$ represents the echo delay time, that is, the time between the initial 90° pulse and the appearance of the echo, and where $I_o$ denotes spin-echo amplitude at zero delay time (i.e., $T_E=0$). From the even spin-echo signals ($T_E=4\tau$, $8\tau$, etc.), it is possible to compute, using curve-fitting techniques known to those skilled in the art, a fictitious image pixel value which would be observed at, for example, $T_E=0$. Likewise, the same fictitious echo amplitude is obtained from the odd echoes at $T_E=2\tau$, $6\tau$, etc., since their amplitudes lie at the same decay curve designated 120 in FIG. 3. Hence, by subtracting the pixel value of the odd echoes from that of the even echoes exact signal cancellation occurs. In the example described herein, the fictitious pixel values were computed for $T_E=0$. However, fictitious pixel values could also be calculated for echo delay times $T_E \neq 0$, as long as the values derived from odd and even echoes are calculated for the same value of $T_E$.

By contrast, if flow is present, complete refocussing occurs only for the even echoes appearing at $T_E=4\tau$ and $8\tau$, as shown in FIG. 4. Therefore, the computed (fictitious) spin-echo amplitudes at time $T_E=0$ will be different for the even and odd spin echoes. In fact, there is only partial refocussing of the NMR signal at $T_E=2\tau$, $6\tau$, etc. Therefore, when the fictitious echo amplitude that would be observed at $T_E=0$ is calculated from the odd echoes, a much lower value $I_o'$ calculated using the decay curve designated by reference numeral 116 is obtained, than the value $I_o$ calculated using the even spin-echo amplitudes which decay along a curve designated 118. Thus, contrary to the behavior for the stationary protons, the difference between values $I_o'$ and $I_o$ of the extrapolated $T_2$ decay curve for odd and even spin echoes in the case of flowing protons will be different. Hence, the resulting difference image derived in the manner described hereinabove will highlight the flowing nuclear spins only, whereas those due to stationary nuclear spins, that is, non-moving spins, will experience exact cancellation. Images have been obtained in accordance with the invention utilizing a spin-echo train in which the echoes occurred at times $T_E=25$, 50, 75, and 100 milliseconds. Although the invention has been described with reference to a spin-echo train comprised of four signals, the invention may be practiced with a greater number of spin-echo signals.

From the foregoing, it will be appreciated that in accordance with the invention, a method is provided for reconstructing pure flow images in which contributions from stationary nuclear spins are removed by cancellation. The method for reconstructing the flow images is compatible with conventional multiple echo proton image reconstruction techniques.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

What is claimed is:

1. A method of imaging nuclear spin flow in a predetermined object region, which region is positioned in a homogeneous magnetic field, the flow within the region having a velocity component in the direction of a read-out magnetic field gradient, said method comprising:
   (a) exciting to resonance a plurality of nuclear spins in the predetermined region of said object;
   (b) subjecting said excited nuclear spins to a phase-encoding magnetic field gradient having a plurality of programmable amplitude-duration products;
   (c) causing said excited nuclear spins to produce a plurality of even and odd numbered spin-echo signals, the odd numbered ones of said spin-echo signals having reduced amplitudes relative to even-numbered ones of said spin-echo signals due to flow in the presence of the read-out magnetic field gradient;
   (d) sampling said spin-echo signals in the presence of the read-out gradient;
   (e) repeating, in the course of a complete scan of said predetermined region, steps (a)–(d) a number of times equal to the plurality of programmable amplitude-duration products of said phase-encoding gradient;
   (f) Fourier analyzing said even and odd spin-echo signals to generate corresponding even and odd image pixel data arrays;
   (g) combining corresponding image pixel data in the even and odd pixel arrays to eliminate image contributions due to stationary nuclear spins, leaving substantially only signal contributions due to flowing nuclear spins in the predetermined region; and
   (h) displaying pixel data corresponding to flowing nuclear spins.

2. The method of claim 1 wherein said step of combining comprises the step of extrapolating the actual pixel data derived from the odd-numbered spin-echo signals and extrapolating the actual pixel data derived from the even-numbered spin-echo signals to a predetermined spin-echo time $T_E$, such that the combination of the extrapolated pixel values results in difference pixel values highlighting flowing nuclear spins, while stationary nuclear spin pixel data is substantially cancelled.

3. The method of claim 2 wherein said step of combining comprises subtracting the extrapolated image pixel data.

4. The method of claim 3 wherein said predetermined spin-echo time is selected such that $T_E=0$.

5. The method of claim 3 wherein said predetermined spin-echo time is selected such that $T_E \neq 0$.

6. The method of claim 3 wherein said step of exciting comprises irradiating said object with a selective RF pulse in the presence of a magnetic field gradient so as to excite nuclear spins substantially in the predetermined region, including any nuclear spins flowing therein.

7. The method of claim 6 wherein said RF pulse comprises a selective 90° RF pulse.

8. The method of claim 6 wherein said phase-encoding gradient is applied in a direction orthogonal to the direction of the read-out gradient.

9. The method of claim 8 wherein said step (c) for producing a plurality of spin-echo signals comprises irradiating said region with a plurality of 180° RF pulses applied in the direction of said phase-encoding gradient.

* * * * *